United States Patent [19]

Morris et al.

[11] Patent Number: 5,420,052
[45] Date of Patent: May 30, 1995

[54] METHOD OF FABRICATING A SEMIPLANAR HETEROJUNCTION BIPOLAR TRANSISTOR

[75] Inventors: Francis J. Morris, Plano; Jau-Yuann Yang, Richardson; Donald L. Plumton; Han-Tzong Yuan, both of Dallas, all of Tex.

[73] Assignee: Texas Instruments Incorporated, Dallas, Tex.

[21] Appl. No.: 230,357

[22] Filed: Apr. 19, 1994

[51] Int. Cl.$^6$ .......................................... H01L 21/265
[52] U.S. Cl. ...................... 437/31; 437/126; 437/133; 148/DIG. 72; 257/197
[58] Field of Search .................... 437/31, 126, 133; 148/DIG. 72, DIG. 10, DIG. 11; 257/197, 200

[56] References Cited

U.S. PATENT DOCUMENTS

| 4,012,318 | 4/1991 | Honjo | 437/133 |
| 4,983,532 | 1/1991 | Mitani et al. | 437/203 |
| 5,047,365 | 9/1991 | Kawanaka et al. | 148/DIG. 72 |
| 5,068,756 | 11/1991 | Morris et al. | 357/16 |
| 5,077,231 | 12/1991 | Plumton et al. | 437/51 |
| 5,233,449 | 6/1993 | Morris et al. | 148/DIG. 72 |

FOREIGN PATENT DOCUMENTS

| 3166265 | 7/1988 | Japan | 257/197 |
| 4057665 | 3/1989 | Japan | 257/197 |

OTHER PUBLICATIONS

Kimiyoshi Yamasaki, Kazuyoshi Asai, and Katsuhiko Kuramada, "GaAs LSI-Directed MESFET's with Self-Aligned Implantation for n+-Layer Technology (SAINT)", *IEEE Transactions on Electron Devices*, vol. ED-29, No. 11, Nov. 1982, pp. 1772–1777.

Shin-Ichi Shikata, Jun-Ichi Tsuchimoto, and Hideki Hayashi, "A Novel Self-Aligned Gate Process for Half-Micrometer Gate GaAs IC's Using ECR-CVD", *IEEE Transactions on Electron Devices*, vol. 37, No. 8, Aug. 1990, pp. 1800–1803.

*Primary Examiner*—Olik Chaudhuri
*Assistant Examiner*—Long Pham
*Attorney, Agent, or Firm*—Carlton H. Hoel; Rene Grossman; Richard L. Donaldson

[57] ABSTRACT

A method of fabricating a semiplanar heterojunction bipolar transistor (10) includes forming a subcollector layer (12) and a collector layer (16) onto a substrate layer (14). A collector implant plug (18) is selectively implanted to connect the subcollector layer (12) to the surface of the heterojunction bipolar transistor (10). A second epitaxial growth process causes a base layer (22), an emitter layer (24), and an emitter cap layer (26) to form on the collector layer (16) and the collector implant plug (18). By this process, the base layer (22) is not exposed to subsequent harmful fabrication steps. A base plug region (28) is selectively implanted to connect the base layer (22) to the surface of the heterojunction bipolar transistor (10). A base contact (32) and an emitter contact (30) are selectively formed within the heterojunction region on the base plug region (28) and the emitter cap layer (26), respectively. Lateral parasitic diodes between the base contact (32) and the emitter contact (30) are etched away to isolate the base contact (32) from the emitter contact (30). The emitter cap layer (26), the emitter layer (24), and the base layer (22) are removed from the vicinity of the collector implant plug (18) to allow formation of the collector contact (34).

17 Claims, 2 Drawing Sheets

METHOD OF FABRICATING A SEMIPLANAR HETEROJUNCTION BIPOLAR TRANSISTOR

TECHNICAL FIELD OF THE INVENTION

The present invention relates in general to semiconductor fabrication processes and more particularly to a method of fabricating a semiplanar heterojunction bipolar transistor.

BACKGROUND OF THE INVENTION

The most critical junction in a heterojunction bipolar transistor is the interface between the base and emitter layers. In previous epitaxial overgrowth heterojunction bipolar transistor fabrication processes, the interface between the initial epitaxial layers and the emitter overgrowth layers occurs at the base-emitter junction of the heterojunction bipolar transistor. In such a process, the base layer is exposed to various processes prior to the emitter overgrowth process. Through this exposure, the base layer may be damaged or washed away by various fabrication process steps. A poor overgrowth interface can result in large numbers of interface states resulting in poor current gains due to recombination in the base-emitter junction. Therefore, it is desirable to fabricate a heterojunction bipolar transistor that avoids exposing the base layer or the base-emitter interface to unnecessary fabrication process steps.

SUMMARY OF THE INVENTION

From the foregoing, it may be appreciated that a need has arisen for a method of fabricating a heterojunction bipolar transistor that does not expose the base layer during fabrication. A need has also arisen for a heterojunction bipolar transistor that avoids recombination at the base-emitter junction that adversely affects the current gain of the transistor.

In accordance with the present invention, a method of fabricating a semiplanar heterojunction bipolar transistor is provided which substantially eliminates or reduces disadvantages and problems associated with previous epitaxial overgrowth heterojunction bipolar transistor fabrication processes.

According to an embodiment of the present invention, there is provided a method of fabricating a semiplanar heterojunction bipolar transistor that includes forming a subcollector layer having a first conductivity type onto a substrate layer. A collector layer having the first conductivity type is formed on the subcollector layer. A collector plug region having the first conductivity type is formed through a selected portion of the collector layer and the subcollector layer. A base layer having a second conductivity type is formed on the collector layer and the collector plug region. An emitter layer having the first conductivity type is formed on the base layer and an emitter cap layer having the first conductivity type is formed on the emitter layer. A base plug region having the second conductivity type is formed through a selected portion of the emitter cap layer and the emitter layer to the base layer. The base plug region is isolated from the emitter cap layer and a base contact is formed on the base plug region. An emitter contact is formed on the emitter cap layer and a collector contact is formed on the collector plug region.

The method of the present invention provides various technical advantages over previous epitaxial overgrowth heterojunction bipolar transistor fabrication processes. For example, one technical advantage is in placing the overgrowth interface at the less critical collector-base junction. Another technical advantage is in avoiding exposure of the base layer to harmful fabrication steps. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

FIGS. 1A-E show the process steps for fabricating a semiplanar heterojunction bipolar transistor 10. The process steps that follow are directed to an NPN device but can readily be adapted to fabricate a PNP device. Further, the process steps use gallium arsenide as the primary layer material, but other elements in Group III and Group V of the periodic table may also be used in substitution. The process begins in FIG. 1A where a subcollector layer 12 having an N+ conductivity type is epitaxially grown on a substrate layer 14. A collector layer 16 having an N− conductivity type is epitaxially grown onto subcollector layer 12.

Figure 1A:
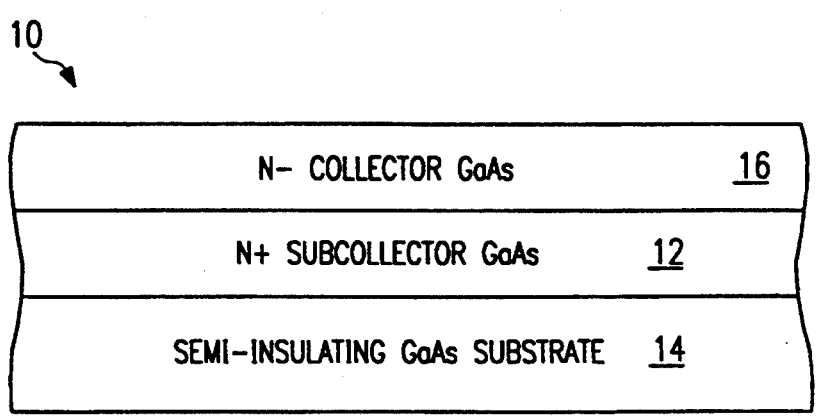
FIGS. 1A-E illustrate a fabrication process for a heterojunction bipolar transistor.
Figure 1B:
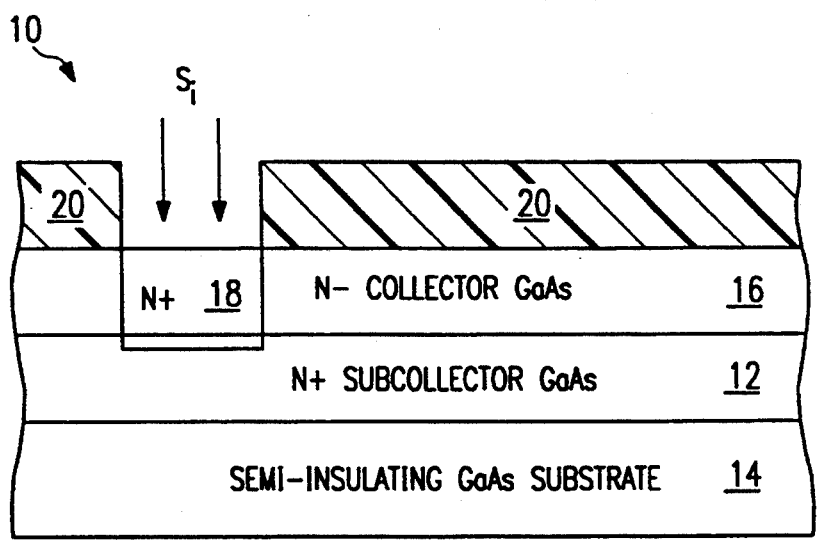

The process continues in FIG. 1B where a collector plug region 18 is selectively implanted through use of a photoresist layer 20. Collector plug region 18 has an N+ conductivity type and connects subcollector layer 12 to the top surface of heterojunction bipolar transistor 10. Since no base layer has been placed at this time, collector plug region 18 can be annealed at a higher temperature than in previous epitaxial overgrowth heterojunction bipolar transistor fabrication processes, resulting in an even lower plug resistivity due to better implant activation. Collector plug region 18 may also be formed through selective etching and deposition.

Figure 1C:
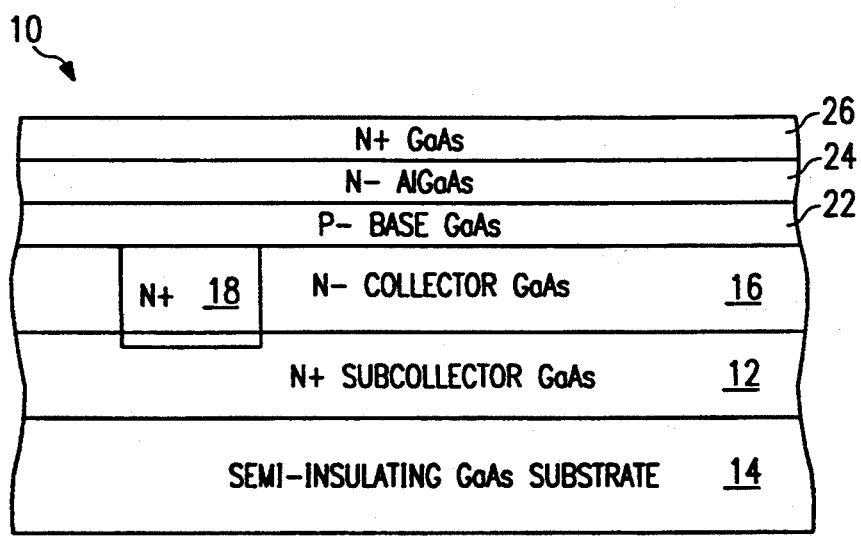

The process continues in FIG. 1C where a base layer 22 having a P− conductivity type is epitaxially grown onto collector layer 16 and collector plug region 18. An emitter layer 24 having an N− conductivity type is epitaxially grown onto base layer 22. An emitter cap layer 26 having an N+ conductivity type is epitaxially grown onto emitter layer 24. By immediately growing emitter layer 24 onto base layer 22, base layer 22 is not exposed to other process steps which could damage base layer 22 and lead to recombination at the base-emitter junction.

Figure 1D:
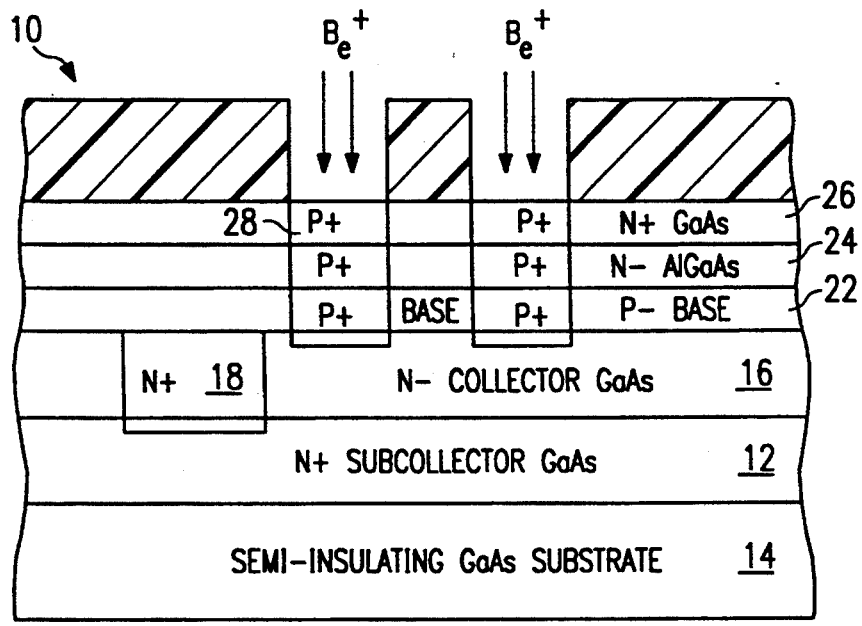

The process continues in FIG. 1D where a base plug region 28 having a P+ conductivity type is selectively implanted through emitter cap layer 26 and emitter layer 24 to base layer 22 to allow connection of base layer 22 to the top surface. Alternatively, the emitter cap layer and the emitter layer at a selected point of the transistor can be removed to reveal a portion of the base layer and the base contact can placed on the revealed portion. A further alternative includes etching away the emitter cap layer to reveal the emitter layer and depositing the base contact metal on the revealed portion of the emitter layer and annealing the base contact such that the metal penetrates through the emitter layer and forms an ohmic contact with the underlying base layer.

Figure 1E:
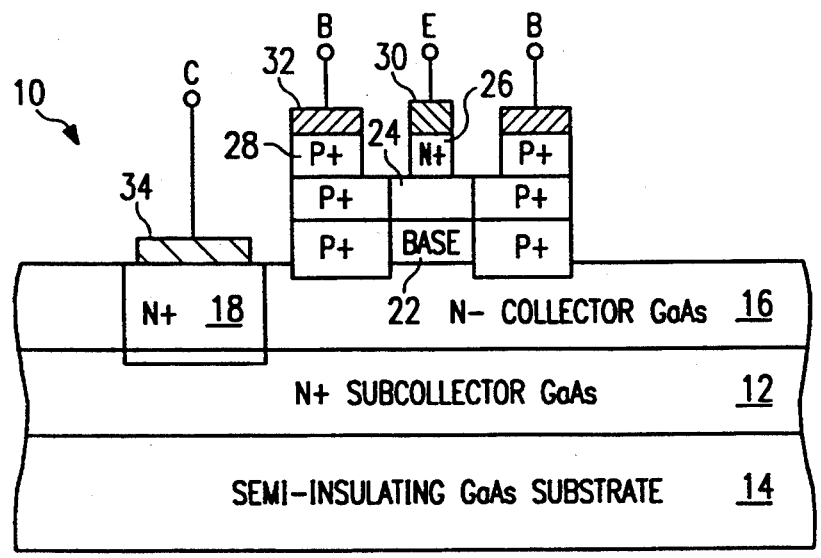

The process continues in FIG. 1E where an emitter contact 30 is deposited onto the surface of heterojunction bipolar transistor 10 and lifted off except in the desired region. A base contact 32 is similarly formed through deposition and selected lifting off. Lateral parasitic diodes between base contact 32 and emitter contact 30 are removed by an etching process which selectively stops on emitter layer 24. Emitter layer 24 remains between the base and emitter contact regions to passivate these regions in order to reduce the base recombination current and for improved reliability.

To form a collector contact 34, base layer 22 is etched away from collector plug region 18. The etch does not need to extend down to the buried subcollector layer 12 since collector plug region 18 brings a low resistance contact region to just below base layer 22. Collector contact 34 can be made after etching emitter cap layer 26, emitter layer 24, and base layer 22 from outside the active heterojunction bipolar transistor regions. This reduction in the etch steps significantly reduces the step height necessary for metal connections to cross as compared to conventional fabrication processes. Though not shown, a damage implant step may be added to electrically isolate individual transistors. The process is completed by the addition of multilevel metal interconnects.

In summary, a heterojunction bipolar transistor is fabricated using two separate epitaxial growth processes where the epitaxial overgrowth interface occurs at the base-collector junction rather than the base-emitter junction as in conventional overgrowth fabrication processes. In this manner, the base layer is not exposed to process steps which could damage and erode the base layer and affect operation of the transistor device.

Thus, it is apparent that there has been provided in accordance with the present invention, a method of fabricating a semiplanar heterojunction bipolar transistor that satisfies the advantages set forth above. Although the preferred embodiment has been described in detail, it should be understood that various changes, substitutions, and alterations can be made herein. For example, process steps and process materials may be altered while preventing base layer exposure. Other examples are readily ascertainable by one skilled in the art and could be made without departing from the spirit and scope of the present invention as defined by the following claims.

What is claimed is:

1. A method of fabricating a semi-planar heterojunction bipolar transistor, comprising the steps of:
   forming a subcollector layer on a substrate layer;
   forming a collector layer on the subcollector layer;
   forming a collector plug region through a selected portion of the collector layer to the subcollector layer;
   forming a base layer on the collector layer and the collector plug region;
   forming an emitter layer type on the base layer;
   forming an emitter cap layer on the emitter layer;
   forming a collector contact on the collector plug region;
   forming an emitter contact on the emitter cap layer;
   forming a base contact on the base layer.

2. The method of claim 1, wherein said collector contact forming step includes removing the emitter cap layer, the emitter layer, and the base layer from the collector plug region.

3. The method of claim 1, wherein said collector plug region forming step includes removing a selected portion of the collector layer to the subcollector layer and placing the collector plug region in contact with the subcollector layer in the selected portion of the collector layer.

4. The method of claim 1, wherein said base contact forming step includes forming a base plug region through a selected portion of the emitter cap layer and the emitter layer to the base layer and isolating the base plug region from the remainder of the emitter cap layer.

5. The method of claim 4, wherein said base plus region isolating step includes removing the portion of the emitter cap layer between the base contact and the emitter contact.

6. The method of claim 4, wherein the step of forming a base plug includes implanting beryllium.

7. The method of claim 1, wherein said base contact forming step includes removing the emitter cap layer and the emitter layer at a selected point of the transistor to reveal a portion of the base layer and placing the base contact on the revealed portion of the base layer.

8. The method of claim 1, wherein each layer is made of materials from Group III and Group V elements of the periodic table.

9. The method of claim 8, wherein each layer includes gallium and arsenic.

10. A method of fabricating a semi-planar heterojunction bipolar transistor, comprising the steps of:
    epitaxially growing a subcollector layer having a first conductivity type onto a substrate layer;
    epitaxially growing a collector layer having the first conductivity type onto the subcollector layer;
    forming a collector plug region having the first conductivity type through a selected portion of the collector layer to the subcollector layer;
    annealing the collector plug region to reduce resistivity;
    epitaxially overgrowing a base layer having a second conductivity type onto the collector layer and the collector plug region;
    epitaxially overgrowing an emitter layer having the first conductivity type onto the base layer;
    epitaxially overgrowing an emitter cap layer having the first conductivity type onto the emitter layer;
    forming a collector contact onto the collector plug region;
    depositing an emitter contact onto the emitter cap layer;
    forming a base contact to the base layer.

11. The method of claim 10, wherein said collector contact forming step includes etching away portions of the emitter cap layer, the emitter layer, and the base layer to reveal the collector plug region and depositing the collector contact onto the collector plug region.

12. The method of claim 10, wherein said base contact forming step includes forming a base plug region through the emitter cap layer and the emitter layer to the base layer and depositing the base contact onto the base plug region.

13. The method of claim 12, wherein said base plug region forming step includes implanting the base plug region through a selected portion of the emitter cap layer and the emitter layer to the base layer and isolating the base plug region from the remainder of the emitter cap layer.

14. The method of claim 13, wherein said base plus region isolating step includes etching the portion of the emitter cap layer between the base contact and the emitter contact.

15. The method of claim 10, wherein said collector plug region forming step includes implanting the collector plug region through the collector layer to the sub-collector layer.

16. The method of claim 10, wherein said base contact forming step includes etching away the emitter cap layer and the emitter layer at a selected point of the transistor to reveal the base layer and depositing the base contact on the revealed portion of the base layer.

17. The method of claim 10, wherein said base contact forming step includes etching away the emitter cap layer to reveal the emitter layer and depositing the base contact metal on the revealed portion of the emitter layer and annealing the base contact such that the metal penetrates through the emitter layer and forms an ohmic contact with the underlying base layer.

* * * * *